US010796937B2

United States Patent
Yoon et al.

(10) Patent No.: US 10,796,937 B2
(45) Date of Patent: Oct. 6, 2020

(54) EQUIPMENT FRONT END MODULE

(71) Applicant: CLEAN FACTOMATION, INC., Gyeonggi-do (KR)

(72) Inventors: June Phil Yoon, Seoul (KR); Jae Won Jang, Asan-si (KR)

(73) Assignee: CLEAN FACTOMATION, INC., Gyeonggi-Do (KR)

( * ) Notice: Subject to any disclaimer, the term of this patent is extended or adjusted under 35 U.S.C. 154(b) by 0 days.

(21) Appl. No.: 16/296,423

(22) Filed: Mar. 8, 2019

(65) Prior Publication Data

US 2020/0105561 A1    Apr. 2, 2020

(30) Foreign Application Priority Data

Sep. 27, 2018 (KR) .................. 10-2018-0115096

(51) Int. Cl.
*H01L 21/677* (2006.01)
*H01L 21/673* (2006.01)
*H01L 21/67* (2006.01)

(52) U.S. Cl.
CPC .. *H01L 21/67389* (2013.01); *H01L 21/67017* (2013.01); *H01L 21/67265* (2013.01); *H01L 21/67772* (2013.01)

(58) Field of Classification Search
CPC ............... H01L 21/67389; H01L 21/67772
See application file for complete search history.

(56) References Cited

U.S. PATENT DOCUMENTS

| 7,065,898 | B2 * | 6/2006 | Kim | H01L 21/67017 34/78 |
| 7,353,841 | B2 * | 4/2008 | Kono | G05D 16/206 118/715 |
| 7,665,787 | B2 * | 2/2010 | Obayashi | H01L 21/67766 294/103.1 |
| 7,927,058 | B2 * | 4/2011 | Miyajima | H01L 21/67379 414/217.1 |
| 9,818,634 | B2 * | 11/2017 | Omori | H01L 21/67769 |
| 9,929,033 | B2 * | 3/2018 | Emoto | H01L 21/67389 |
| 10,134,619 | B2 * | 11/2018 | Kondoh | H01L 21/67389 |
| 2002/0051701 | A1 * | 5/2002 | Saeki | H01L 21/67775 414/222.01 |
| 2017/0243776 | A1 * | 8/2017 | Murata | H01L 21/67379 |
| 2018/0204753 | A1 * | 7/2018 | Kawai | H01L 21/677 |
| 2018/0244470 | A1 * | 8/2018 | Murata | H01L 21/67769 |
| 2018/0247846 | A1 * | 8/2018 | Murata | B65G 1/02 |

* cited by examiner

Primary Examiner — Jonathan Snelting
(74) Attorney, Agent, or Firm — Davis & Bujold PLLC; Michael J. Bujold

(57) ABSTRACT

Disclosed herein is an equipment front end module (EFEM) including: a transfer chamber; a load port module on which a wafer receiving container is seated; a wafer transfer robot positioned in the transfer chamber and configured to transfer a wafer in the wafer receiving container seated on the load port module toward a process equipment side; and a buffer module configured to store the wafer receiving container before or after the seating of the wafer receiving container on the load port module and inject an inert gas into the FOUP to purge the wafer.

13 Claims, 11 Drawing Sheets

EQUIPMENT FRONT END MODULE

RELATED APPLICATIONS

This application claims priority to Korean Patent Application No. 10-2018-0115096, filed on Sep. 27, 2018, which is herein incorporated by reference in its entirety.

BACKGROUND

Field

The present invention relates to an equipment front end module (EFEM) used to transfer wafers between process equipment and a wafer receiving container.

Description of the Related Art

In a semiconductor manufacturing process, a wafer is processed in a clean room for improvement in yield and quality. However, as elements become more highly integrated, circuits become finer, and wafers become larger, it becomes difficult to keep the entire clean room in a clean state in respect to technique and cost.

In order to solve such a problem, cleanliness has recently been managed only for a space around the wafer. Specifically, the wafers are stored inside a sealed storage pod called a front-opening unified pod (FOUP). In order to transfer the wafers between process equipment for processing the wafer and the FOUP, a device called an equipment front end module (EFEM) is used. Such an EFEM manages the cleanliness of the wafer by carrying out nitrogen filling for the FOUP that is seated on a load port module.

However, in a case in which such a nitrogen filling operation is in progress in the load port module of the EFEM, a vehicle may not unload the FOUP on the corresponding load port module. Accordingly, when the vehicle waits until a completion of the nitrogen filling operation, efficiency of the vehicle operation becomes poor.

The load port module may not perform other operations until the nitrogen filling operation is completed. As a result, productivity of EFEM and the process equipment is reduced.

Further, a wafer transfer robot may not work efficiently in a transfer chamber. For example, in a case in which the wafer transfer robot processes 20 FOUPs per hour (one FOUP accommodates 25 wafers), one new FOUP must be seated on the load port module every 3 minutes for maximum operation efficiency. However, if an existing FOUP is in the nitrogen filling operation on the load port module at a point of time at which the new FOUP must be seated on the load port module, then such operation efficiency may not be achieved.

SUMMARY

An object of the present invention is to provide an equipment front end module (EFEM) that may fully perform a filling operation of inert gas on a front-opening unified pod (FOUP), while also improving operational efficiency of cooperative devices such as a vehicle and a process equipment, and the EFEM itself.

According to an exemplary embodiment of the present invention, there is provided an equipment front end module (EFEM) including: a transfer chamber; a load port module on which a wafer receiving container is seated; a wafer transfer robot positioned in the transfer chamber and configured to transfer a wafer in the wafer receiving container seated on the load port module toward a process equipment side; and a buffer module configured to store the wafer receiving container before or after the seating of the wafer receiving container on the load port module and inject an inert gas into the wafer receiving container to purge the wafer.

The buffer module may include a plurality of supply nozzles connected to an injection port of the wafer receiving container to supply the inert gas into the wafer receiving container; and a buffer control unit controlling a supply of the inert gas to each of the plurality of supply nozzles.

The buffer module may further include a seating detection sensor detecting the seating of the wafer receiving container, and the buffer control unit may selectively intermit the supply of the inert gas to each of the plurality of supply nozzles based on a detection result of the seating detection sensor.

The buffer module may further include a proportional pressure control valve unit adjusting a flow rate of the inert gas supplied to the supply nozzles, and the buffer control unit may intermit the supply of the inert gas by controlling an opening and closing of the proportional pressure control valve unit.

The buffer module may include an information management unit obtaining wafer information on the wafer written in an information storage unit of the wafer receiving container; and a buffer control unit controlling the information management unit, and the buffer control unit may transmit purge information to the information storage unit by controlling the information management unit so that the wafer information is updated to reflect the purge information on a purge of the wafer.

The buffer module may further include a storage housing; and a buffer port famed to support the wafer receiving container and configured to be moved between an inside and an outside of the storage housing.

The buffer port may include a shelf supporting the wafer receiving container while having the seating detection sensor and the supply nozzles.

The buffer module may further include a lift unit transferring the wafer receiving container between the buffer port and the load port module, the buffer port may include a corresponding buffer port corresponding to the load port module; and a non-corresponding buffer port disposed next to the corresponding buffer port, and the lift unit may be configured to be moved between positions corresponding to the corresponding buffer port and the non-corresponding buffer port.

The buffer module may further include a chucking unit installed in the buffer port and configured to be caught by a catching jaw in a catching groove as a posture is changed after being inserted into the catching groove of the wafer receiving container.

The chucking unit may include a hook positioned to correspond to the catching groove; and a rotation driving unit rotating the hook to cause the hook to be caught by the catching jaw.

The chucking unit may further include an elevation driving unit raising the hook before an operation of the rotation driving unit to raise the hook into the catching groove.

The chucking unit may further include an intermediate unit including a plurality of fastening elements and coupled to a rotary shaft of the rotation driving unit, and the hook may be configured to be aligned along a set direction by a fastening with the plurality of fastening elements.

The buffer module may further include a supply nozzle connected to an injection port of the wafer receiving container to supply the inert gas into the wafer receiving container; and a proportional pressure control valve unit adjusting a flow rate of the inert gas supplied to the supply nozzle by an area control method.

The proportional pressure control valve unit may include a valve housing including an input port; and a piezo valve seat installed in the valve housing to adjust a flow area of the inert gas through the input port according to an input voltage.

DETAILED DESCRIPTION

Figure 1:
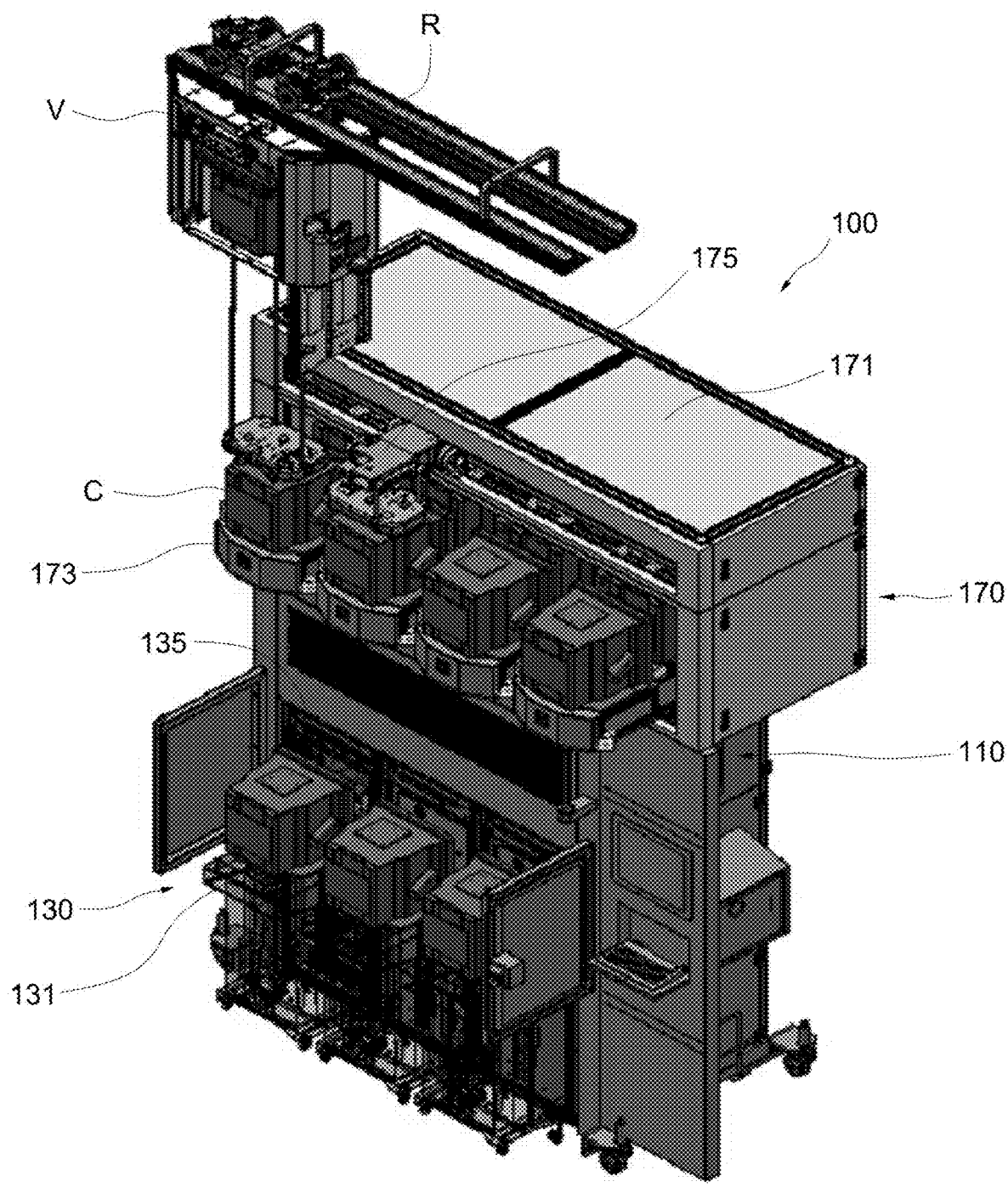
FIG. 1 is a perspective view showing an EFEM 100 according to an exemplary embodiment of the present invention.

Hereinafter, an EFEM according to exemplary embodiments of the present invention will be described in detail with reference to the accompanying drawings. Throughout the present specification, components that are the same as or similar to each other will be denoted by reference numerals that are the same as or similar to each other, and a description therefor will be replaced with a first description, even in different exemplary embodiments.

FIG. 1 is a perspective view showing an EFEM 100 according to an exemplary embodiment of the present invention.

Referring to FIG. 1, the EFEM 100 may selectively include a transfer chamber 110, a load port module 130, a wafer transfer robot 150 (see FIG. 11), and a buffer module 170.

The transfer chamber 110 occupies a rear portion of the EFEM 100 and forms an internal space in which the wafer transfer robot 150 operates. The transfer chamber 110 is disposed to face process equipment, for example, deposition equipment, etching equipment, and the like.

The load port module 130 occupies a front portion of the EFEM 100. The load port module 130 may be disposed to face the transfer chamber 110. The load port module 130 has a support 131 on which a wafer receiving container, for example, a front-opening unified pod (FOUP) C is seated. In the present exemplary embodiment, the load port module 130 includes three supports 131 so that three FOUPs C may be seated on the load port module 130 at a time. In order to allow the wafer transfer robot 150 to access the FOUP C, a door 135 is formed in the load port module 130 to correspond to each support 131.

The wafer transfer robot 150 operates in the transfer chamber 110, and is configured to transfer a wafer before processing in the FOUP C to a process equipment side. Further, the wafer transfer robot 150 transfers a wafer after processing to a load port module 130 side and puts it into the FOUP C.

The buffer module 170 is located above the load port module 130 and the transfer chamber 110 and provides a space for storing the FOUP C therein. To this end, the buffer module 170 may have a storage housing 171, a buffer port 173, and a lift unit 175. The storage housing 171, which is a box having substantially a form of a rectangular parallelepiped, may have the form in which a front thereof is opened. The buffer port 173 may be configured to be moved between an inside and an outside of the storage housing 171 through the front opened space of the storage housing 171. The lift unit 175 is configured to transfer the FOUP C seated on the buffer port 173 to the load port module 130, or transfer the FOUP C in an opposite direction. The FOUP C is stored in the buffer module 170 before or after it is seated on the load port module 130, and is injected with an inert gas while being seated in the buffer port 173. The inert gas may be, for example, nitrogen, and the wafer in the FOUP C is purged by the inert gas to prevent oxidation. In the present exemplary embodiment, four buffer ports 173 are provided and the number of buffer ports 173 is one more than three supports 131 of the load port module 130. Here, the buffer ports corresponding to the three supports 131 of the buffer port 173 may be referred to as a corresponding buffer port, and the other one may be referred to as a non-corresponding buffer port. The lift unit 175 is configured to be moved between positions corresponding to both the corresponding buffer port and the non-corresponding buffer port.

According to such a configuration, a vehicle V constituting an overhead hoist transport (OHT) system reaches a position corresponding to the EFEM 100 while moving along a rail R. The vehicle V may unload the FOUP C that is being transferred to the buffer port 173 of the buffer module 170. To this end, the buffer port 173 may be moved to the outside of the storage housing 171 and wait to take over the FOUP C. The buffer port 173 taking over the FOUP C may move to the inside of the storage housing 171. Further, the FOUP C is injected with the inert gas while being stored in the buffer module 170 and the wafer in the FOUP C may be purged.

The lift unit 175 may put down the FOUP C subjected to the purge on the load port module 130. With respect to the FOUP C put down on the load port module 130, the wafer transfer robot 150 in the transfer chamber 110 may transfer the purged wafer to the process equipment side. When a work on the wafer is completed on the process equipment side, the wafer transfer robot 150 puts the wafer into the FOUP C seated on the load port module 130. The FOUP C receiving the processed wafer is transferred to the buffer port 173 by the lift unit 175. When the FOUP C receiving the processed wafer needs to wait for a long time, the buffer module 170 additionally injects the inert gas into the FOUP C. Thereafter, the vehicle V grasps the FOUP C and moves along the rail R toward the other process equipment.

In such a process, the injection of the inert gas to the FOUP C and hence the purge of the wafer is performed at a step before or after the FOUP C is seated on the load port module 130, not a step in which the FOUP C is seated on the load port module 130. In other words, the injection of the inert gas to the FOUP C is performed in the buffer module 170 which is separate from the load port module 130. Even if the injection of the inert gas to the FOUP is performed in the load port module 130, this is at a level that complements a function of the buffer module 170, so that the waiting time of the FOUP C in the load port module 130 does not become long.

The buffer module 170 described above will be described in more detail with reference to FIG. 2. For convenience of explanation, the buffer module 170 is also referred to as 200 by reference numeral.

Figure 2:
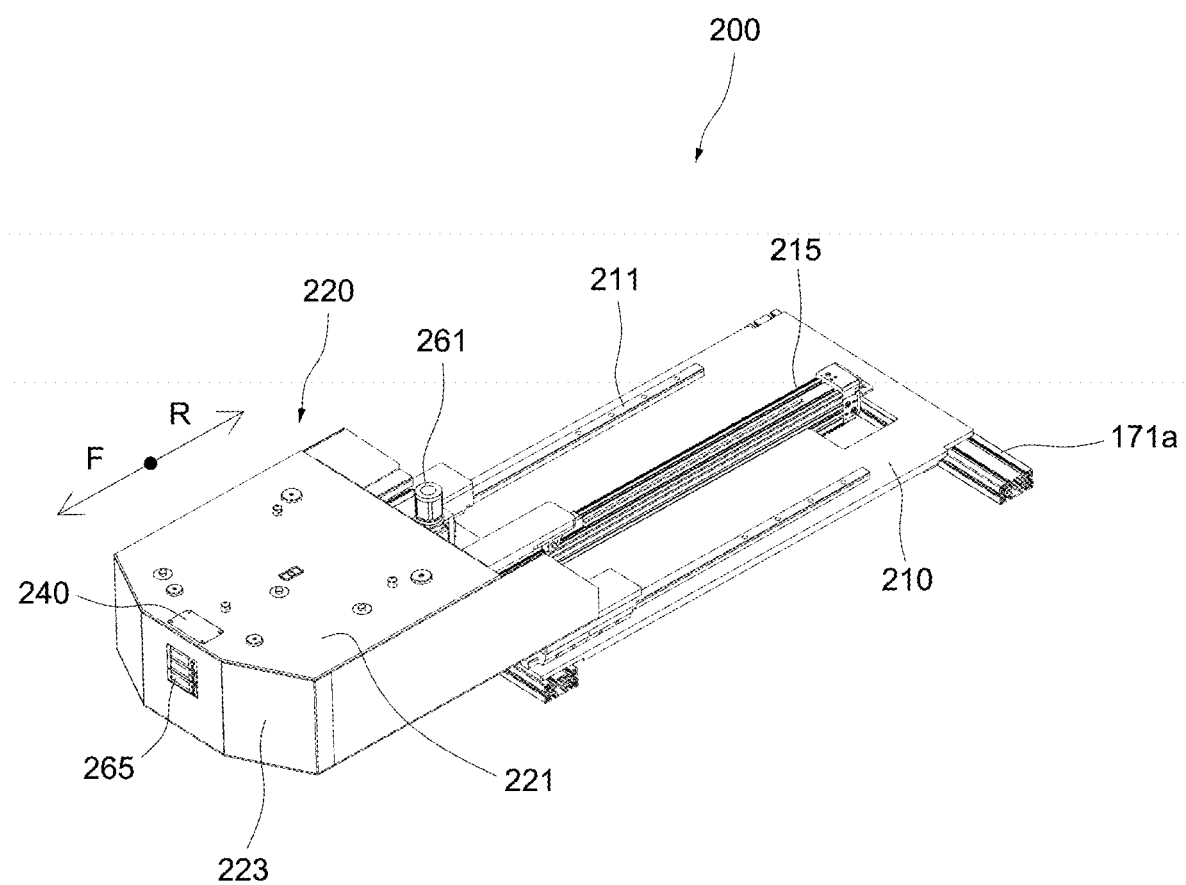
FIG. 2 is an assembled perspective view showing a configuration related to a buffer port 220 of a buffer module 200 of FIG. 1.
Figure 3:
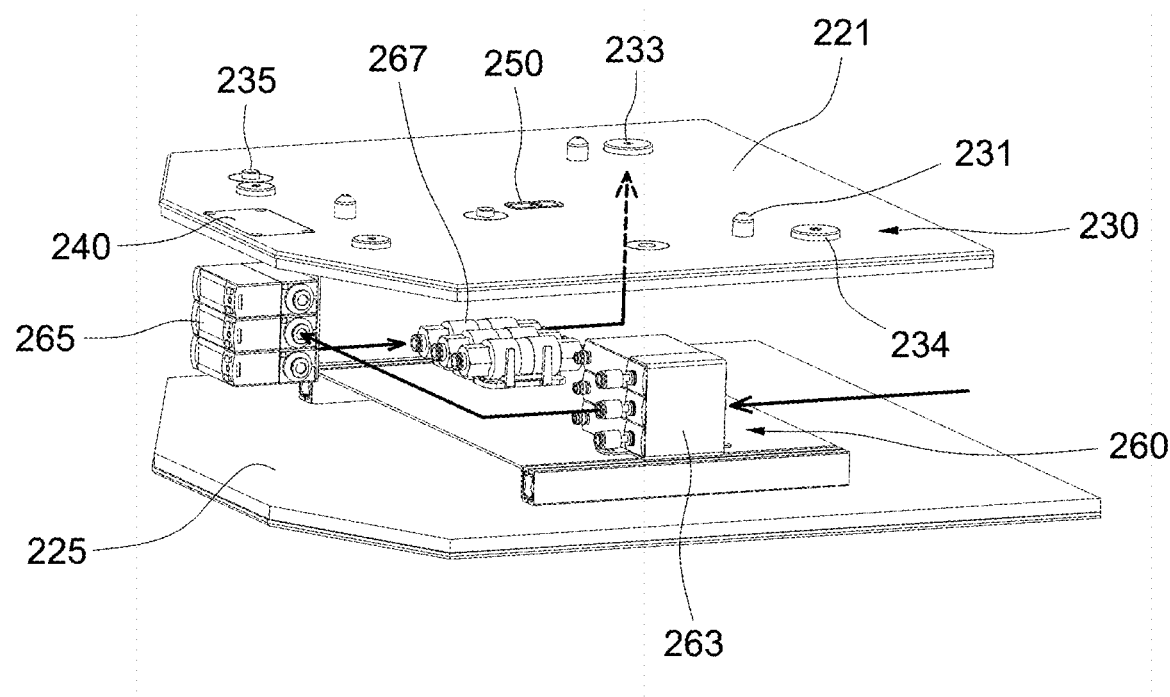
FIG. 3 is an exploded perspective view of a principal part of a configuration related to the buffer port 220 of FIG. 2.
Figure 4:
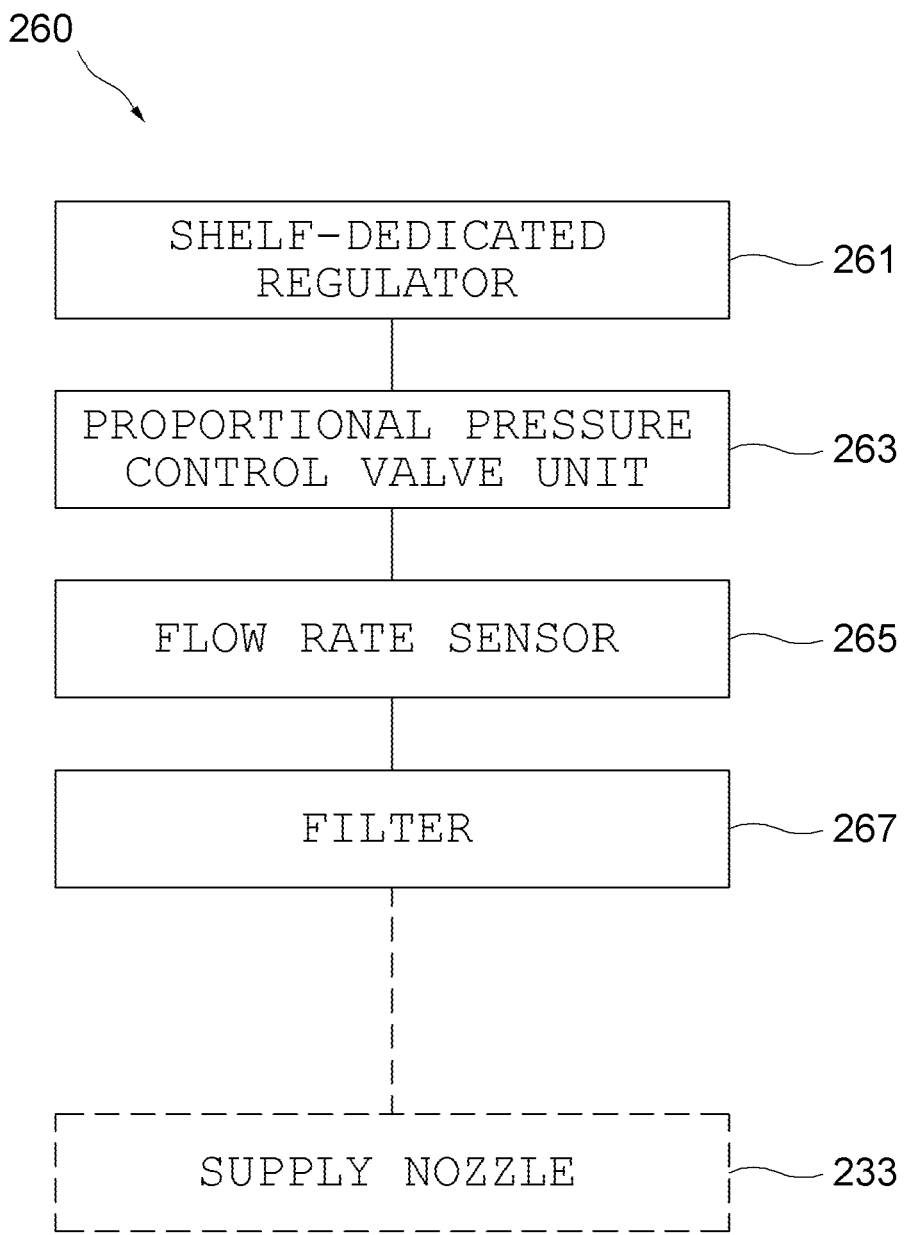
FIG. 4 is a block diagram describing a gas supply line 260 installed in the buffer module 200 of FIG. 3.

FIG. 2 is an assembled perspective view showing a configuration related to a buffer port 220 of a buffer module 200 of FIG. 1, FIG. 3 is an exploded perspective view of a configuration related to the buffer port 220 of FIG. 2, and FIG. 4 is a block diagram describing a gas supply line 260 installed in the buffer module 200 of FIG. 3.

Referring to the present drawings, the buffer module 200 includes a mount 210, a buffer port 220, a shelf installation 230, an information management unit 240, a chucking unit 250, and a gas supply line 260.

The mount 210 is a member installed in a frame 171a of the storage housing 171 (see FIG. 1). The mount 210 may have a generally rectangular plate shape. A guide 211 extending along an outward direction F and an inward direction R may be installed on an upper surface of the mount 210. The guide 211 supports the buffer port 220 moving in the outward direction F and the inward direction R and guides a movement of the buffer port 220. In addition, a buffer port driving unit 215 may be installed parallel to the guide 211. The buffer port driving unit 215 which, is an actuator for driving the buffer port 220 in the outward direction F and the inward direction R, may be, for example, a rodless cylinder.

The buffer port 220 supports the FOUP C (see FIG. 1) and is a configuration that assists filling of the inert gas with FOUP C. The buffer port 220 may structurally include a shelf 221, a cover 223, and a base 225. The shelf 221 is exposed to an upper portion to support the FOUP C in contact with the FOUP C. The cover 223 is disposed to surround a periphery of the shelf 221. The base 225 may be disposed substantially parallel to the shelf 221 below the shelf 221. The chucking unit 250 and the like may be disposed in a space defined by the shelf 221, the cover 223, and the base 225. The base 225 is slidably coupled to the guide 211 and is connected to the buffer port driving unit 215 to be slidably moved in the outward direction F and the inward direction R.

The shelf installation 230 may include various structures installed on the shelf 221 and interacting with the FOUP C. The shelf installation 230 may have a reference pin 231, a supply nozzle 233, an exhaust nozzle 234, and a seating detection sensor 235 in detail. The reference pin 231 is a configuration inserted into a reference groove (not shown) of the FOUP C to guide the FOUP C to be correctly positioned on the shelf 221. The supply nozzle 233 is a configuration connected to an injection port of the FOUP C pressed on the shelf 221 to inject the inert gas into the FOUP C. The number of the supply nozzles 233 is plural, and for example, three supply nozzles may be located in each corner region of the shelf. Further, similarly to the supply nozzle 233, the exhaust nozzle 234 may also be constituted by one nozzle. The exhaust nozzle 234 is a passage through which the inert gas supplied into the FOUP C is discharged to the outside of the FOUP C through an exhaust gas line (not shown). The seating detection sensor 235 is installed on the shelf 221 to detect the seating of the FOUP C, Further, since a plurality of seating detection sensors 235 are configured, another detection result according to a shape of the FOUP C is obtained. Accordingly, the shape of the FOUP C may be determined through the detection result of the seating detection sensor 235.

The information management unit 240 is installed in the shelf 221 and is configured to communicate with an information storage unit (not shown) of the FOUP C. Specifically, the information storage unit of the FOUP C stores wafer information about the wafer received in the FOUP C. The information management unit 240 may communicate with the information storage unit to acquire the wafer information and further transmit new information to the information storage unit to add to the wafer information. Here, the new information may be purge information which is information on the purge of the wafer. The purge information may include information on a purge time, a flow rate of gas injected for purge, and the like. To this end, the information management unit 240 may be a radio frequency identification (RFID) reader/writer, and the information storage unit may be an RFID tag.

The chucking unit 250 is a configuration put at the center of the shelf 221 to chuck the FOUP C placed on the shelf 221. A detailed configuration of the chucking unit 250 will be described later with reference to FIGS. 8 to 10.

The gas supply line 260 is a configuration that communicates with a gas supply facility of a semiconductor production factory so as to fill the inert gas in the FOUP C. The gas supply line 260 may specifically include a shelf-dedicated regulator 261, a proportional pressure control valve unit 263, a flow rate sensor 265, and a filter 267.

The shelf-dedicated regulator 261 is a configuration that communicates with the gas supply facility of the factory through a pipe, and depressurizes the inert gas supplied from the gas supply facility to maintain it at a constant pressure. Since the shelf-dedicated regulator 261 is provided for each shelf 221, it is exclusively used for only the gas supply line 260 installed in the shelf 221. By the shelf-dedicated regulator 261, the inert gas supplied to the proportional pressure control valve unit 263 located on a downstream side of the gas supply line 260 always maintains a set pressure and is free from a hunting phenomenon.

The proportional pressure control valve unit 263 is a configuration that controls the flow rate of the inert gas to supply the inert gas having the constant pressure input through the shelf-dedicated regulator 261 to the FOUP C to a required level. The proportional pressure control valve unit 263 is a configuration that adjusts an area of the portion through which the inert gas passes in the valve to adjust the pressure of the inert gas and further the flow rate thereof. Thereby, the flow rate of the inert gas may be adjusted analogously, and the degree of precision of the flow rate adjustment may be significantly increased. According to the inventor's experiment, an error of the flow rate adjustment is only 0.4%. Three proportional pressure control valve units 263 may be provided corresponding to the three supply nozzles 233. The inert gas passing through the shelf-dedicated regulator 261 branches into three lines and is input to each proportional pressure control valve unit 263.

The flow rate sensor 265 is a configuration disposed downstream of the proportional pressure control valve unit 263 to indicate the flow rate regulated through the proportional pressure control valve unit 263. Since the flow rate sensor 265 is exposed to the outside through an opening of the cover 223, an operator may visually detect the flow rate.

The filter 267 is a configuration disposed between the flow rate sensor 265 and the supply nozzle 233 to remove foreign materials from the inert gas.

In the above description, the shelf-dedicated regulator 261, the proportional pressure control valve unit 263, and the like constituting the gas supply line 260 are illustrated as being mounted on the base 225, but in the absence of the base 225, the shelf-dedicated regulator 261, the proportional pressure control valve unit 263, and the like may also be mounted on a bottom surface of the shelf 221.

The proportional pressure control valve unit 263 will be described with reference to FIGS. 5 and 6. For convenience of explanation, the proportional pressure control valve unit 263 is also referred to as 300 by reference numeral.

Figure 5:
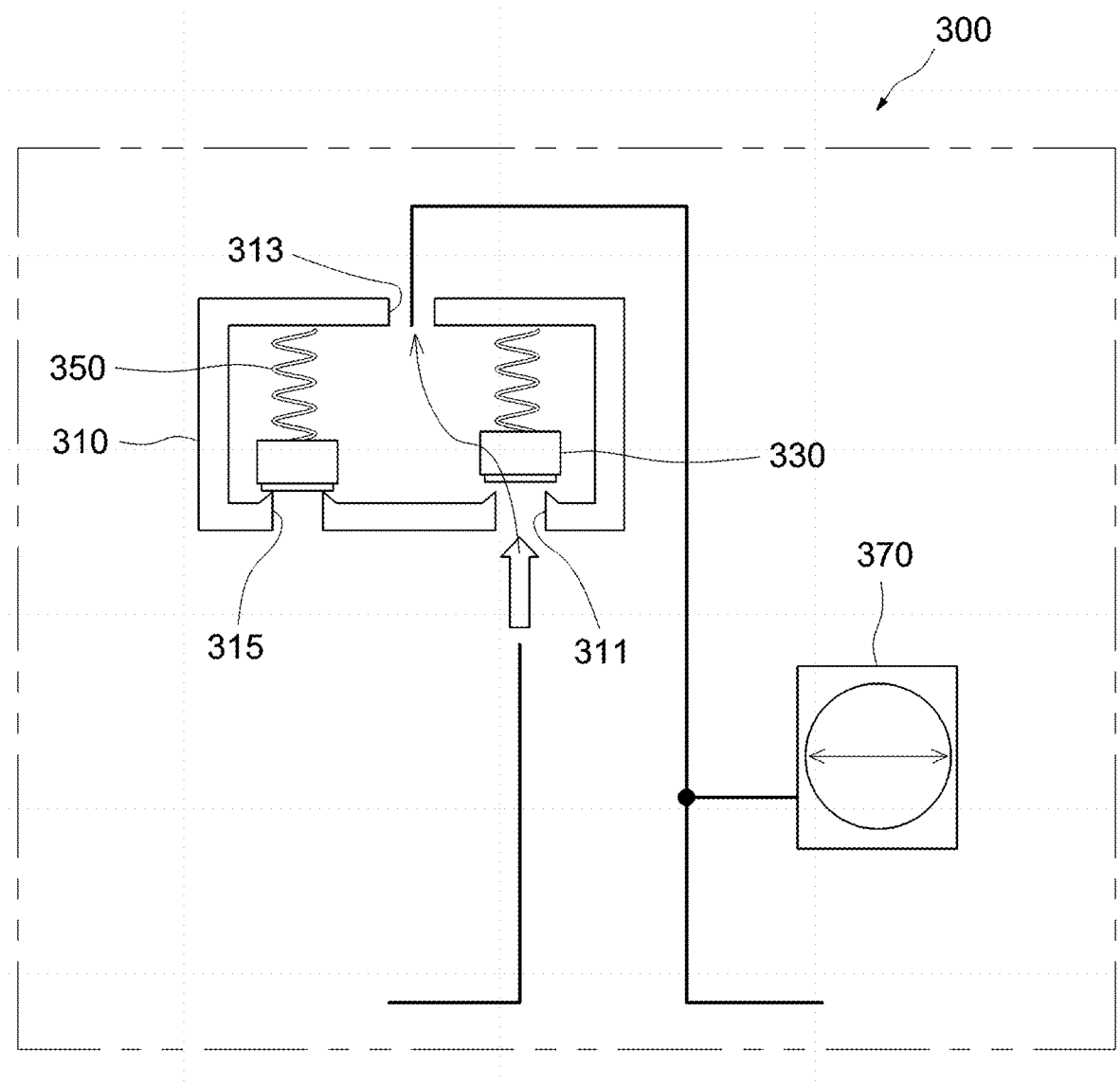
FIG. 5 is a conceptual view showing a configuration of a proportional pressure control valve unit 300 of FIG. 4.

FIG. 5 is a conceptual view showing a configuration of a proportional pressure control valve unit 300 of FIG. 4.

Referring to FIG. 5, the proportional pressure control valve unit 300 may include a valve housing 310, a piezo valve seat 330, a return spring 350, and a pressure sensor 370.

The valve housing 310 may be a hollow body having an internal space. A plurality of ports may be opened in the valve housing 310. As the plurality of ports, an input port 311, an output port 313, and a relief port 315 are illustrated in the present exemplary embodiment. The inert gas having a constant pressure flows into the input port 311 through the shelf-dedicated regulator 261 (see FIG. 4). The inert gas whose flow rate is adjusted by the piezo valve seat 330 is output through the output port 313 to flow toward the flow rate sensor 265 (see FIG. 4). The relief port 315 is used to exhaust a part of the inert gas in the internal space.

The piezo valve seat 330 is disposed in the internal space and opens and closes the input port 311 and the relief port 315. The piezo valve seat 330 includes a piezo material and is deformed by an applied voltage to vary the degree of opening and closing of the input port 311 and the like. Specifically, depending on how far the piezo valve seat 330 closing the input port 311 is bent away from the input port 311, the pressure and the flow rate of the inert gas, which pass through the input port 311 and are output to the output port 313, are varied. This is because an area that the inert gas passes through a space between the input port 311 and the piezo valve seat 330 is varied depending on the degree of bending of the piezo valve seat 330.

The return spring 350 is installed to connect the piezo valve seat 330 and the valve housing 310 to each other. Thereby, the return spring 350 serves to return the piezo valve seat 330 which is bent away from the input port 311 or the like while being bent according to the voltage application toward the input port 311 or the like when the voltage application is reduced/released.

The pressure sensor 370 is a configuration that measures a pressure of the inert gas whose flow rate is adjusted through the output port 313 of the valve housing 310 and is output. Since the pressure sensor 370 is embedded in the proportional pressure control valve unit 300 as described above, it is not necessary to provide a separate pressure sensor on the outside. In addition, since the pressure sensor 370 measures the pressure of the inert gas input to the FOUP C through the supply nozzle 233 in the gas supply line 260 (see FIG. 4), the pressure sensor 370 may provide pressure information that allows the detection as to whether the inert gas is properly input to the FOUP C or leaks without being input to the FOUP C. Specifically, when the inert gas is normally injected into the FOUP C, the pressure is higher than when the inert gas leaks. This is because the pressure of the inert gas is increased by a reaction force of the filter installed at the injection port of the FOUP C. By using the above-mentioned point, it is not necessary to provide a separate pressure sensor or a flow rate sensor to check the gas leakage between the supply nozzle 233 and the FOUP C on the gas exhaust line through which the gas exhausted from the FOUP C flows.

A change in the pressure of the shelf-dedicated regulator 261 in such a proportional pressure control valve unit 300 and a change in an output flow rate of the inert gas according to the change in the voltage applied to the piezo valve seat 330 will be described with reference to FIG. 6.

Figure 6:
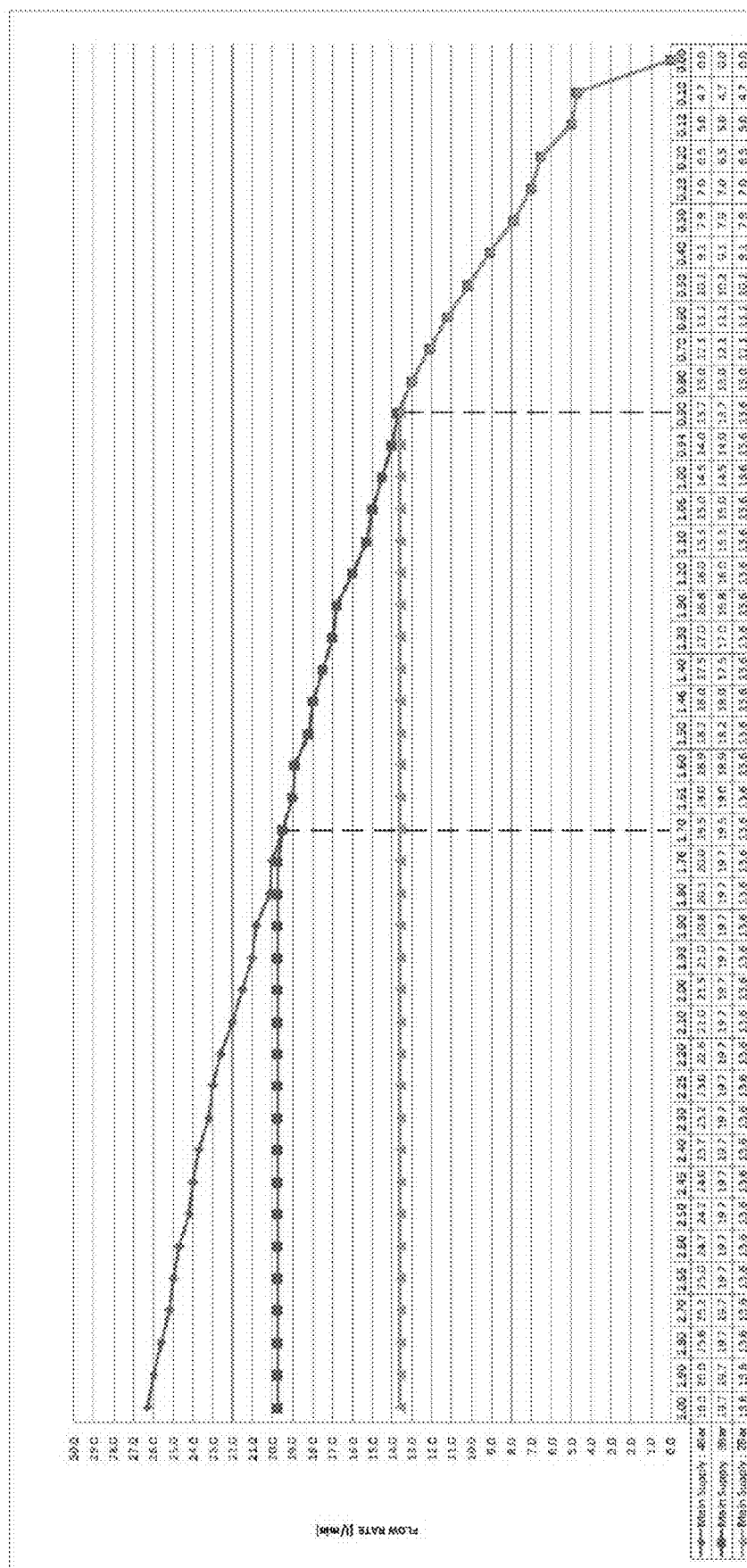
FIG. 6 is a graph showing an experiment result on the proportional pressure control valve unit 300 of FIG. 5.
Figure 7:
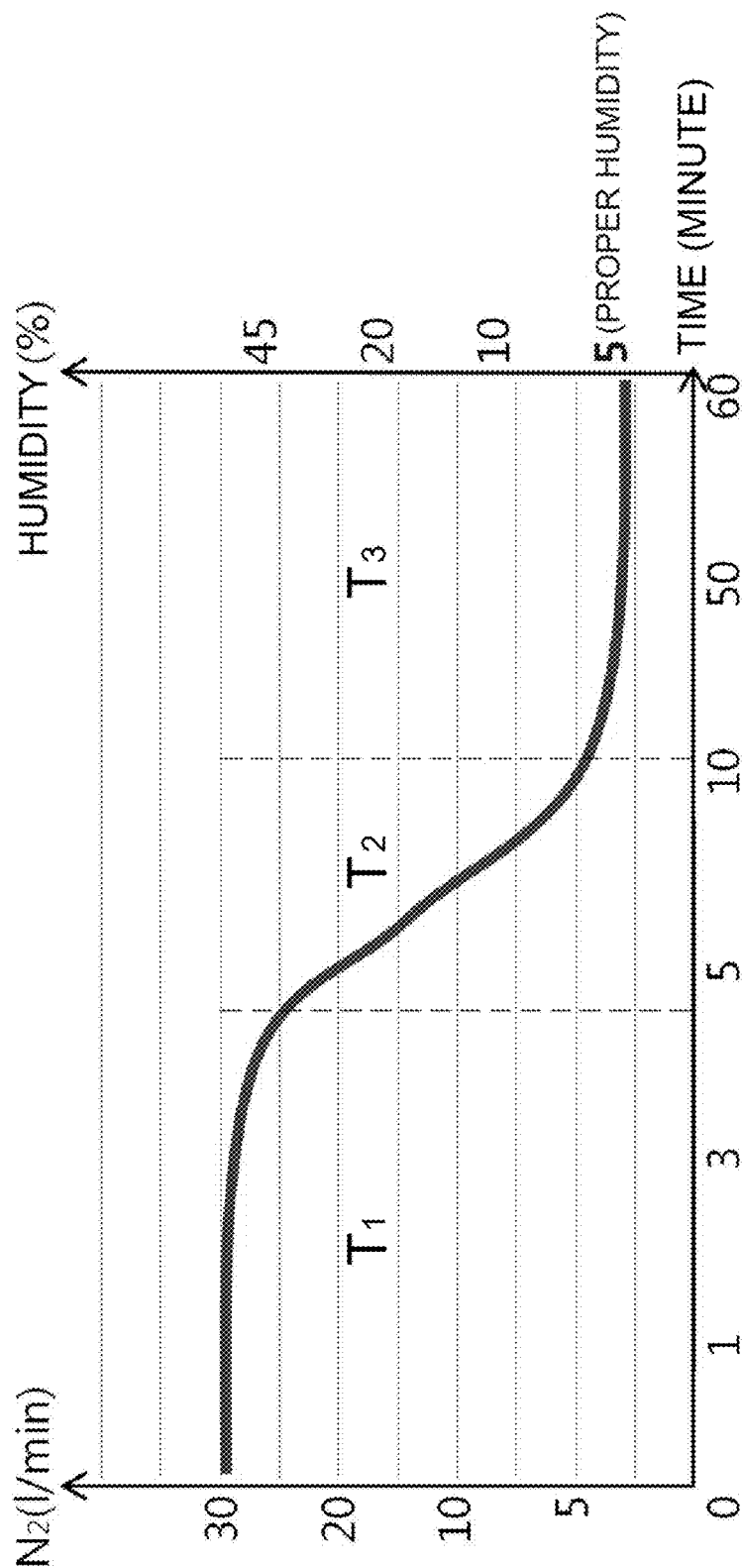
FIG. 7 is a graph showing an ideal change of an inert gas flow rate supplied to a FOUP C by the proportional pressure control valve unit 300 of FIG. 5.

FIG. 6 is a graph showing an experiment result on the proportional pressure control valve unit 300 of FIG. 5 and FIG. 7 is a graph showing an ideal change of an inert gas flow rate supplied to a FOUP C by the proportional pressure control valve unit 300 of FIG. 5.

Referring to FIG. 6, the input pressure of the inert gas adjusted by the shelf-dedicated regulator 261 (see FIG. 4) is adjusted to 2 Bar, 3 Bar, and 4 Bar, respectively. Despite such a change in pressure, when the voltage applied to the piezo valve seat 330 is 0.80 V or less, the flow rate through the proportional pressure control valve unit 300 shows the same value. For example, at 0.80 V, the flow rate is 13.0 l/min regardless of the input pressure of the inert gas, and the flow rate at 0.30 V is 7.9 l/min.

When the pressure of the inert gas adjusted by the shelf-dedicated regulator 261 is 2 Bar, if the applied voltage is 0.94 V or more, the flow rate shows the same value of 13.6 l/min. In other words, even when the applied voltage exceeds 0.94 V and reaches 3.00 V, the flow rate does not exceed 13.6 l/min.

In contrast, when the pressure of the inert gas adjusted by the shelf-dedicated regulator 261 is 3 Bar, if the applied voltage is 1.76 V or more, the flow rate shows the same value of 19.7 l/min.

When the input pressure of the inert gas adjusted by the shelf-dedicated regulator 261 is 4 Bar, the flow rate continuously increases to 26.3 l/min while the applied voltage is increased to 3.00 V. As the flow rate increases, rapid filling of the inert gas to the FOUP C becomes possible. Accordingly, when the FOUP C is just put on the shelf 221, the rapid filling to the FOUP C may be performed.

Specifically, referring to FIG. 7, the FOUP C put on the shelf 221 need not always be supplied with the same flow rate of the inert gas. In an initial stage, the supply flow rate should be large, but after the inert gas is sufficiently filled in the FOUP C after a certain time passes and an inert gas atmosphere is formed, the supply flow rate does not need to be large. Thereby, a proper supply amount of the inert gas sharply decreases after a certain time passes, and thereafter, it is maintained at a minimum amount. On the other hand, if the inert gas is supplied to the FOUP C at the same flow rate, this causes a great waste of the inert gas.

It may be seen from these results that there is a limit to increase the flow rate of the inert gas output from the proportional pressure control valve unit 300 only by increasing the applied voltage applied to the piezo valve seat 330 in the proportional pressure control valve unit 300. In order to solve such a limit, the input pressure of the inert gas supplied to the proportional pressure control valve unit 300 needs to be increased. In such a process, when the pressure of the inert gas supplied to the proportional pressure control valve unit 300 is not uniform and the hunting phenomenon occurs, the proportional pressure control valve unit 300 does not output a set flow rate. Therefore, it is important that the shelf-dedicated regulator 261 for supplying the inert gas of a predetermined pressure to the proportional pressure control valve unit 300 is disposed at an upstream side of the proportional pressure control valve unit 300.

Further, the point of time at which the FOUP C is placed on each shelf 221 is different. Therefore, whether a rapid filling time interval $T_1$, a deceleration filling time interval $T_2$, or a low-speed filling time interval $T_3$ differs depending on each of the shelves 221. It is important that the shelf-dedicated regulator 261 is disposed for each shelf 221 so that different filling types for each shelf 221 may be stably and reliably achieved.

Next, the above-mentioned chucking unit 250 will be described with reference to FIGS. 8 to 10.

Figure 8:
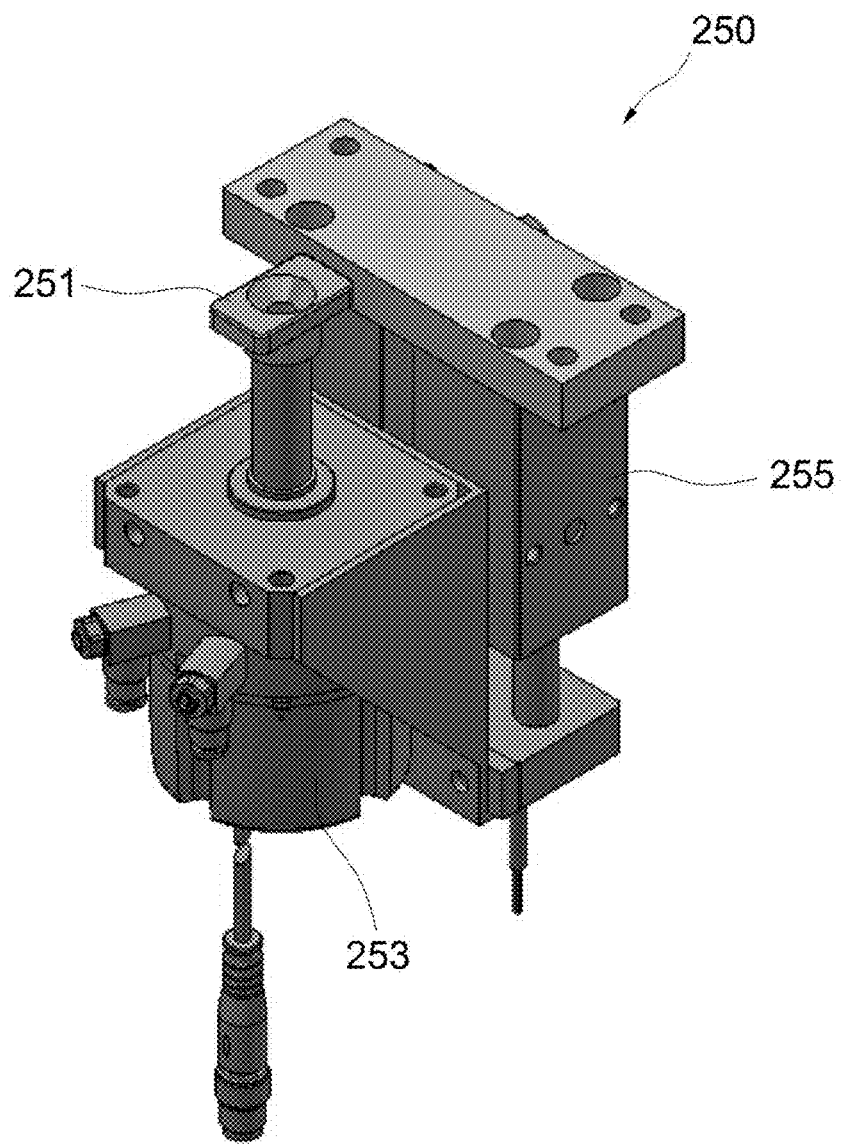
FIG. 8 is an assembled perspective view for a chucking unit 250 of FIG. 2.
Figure 9:
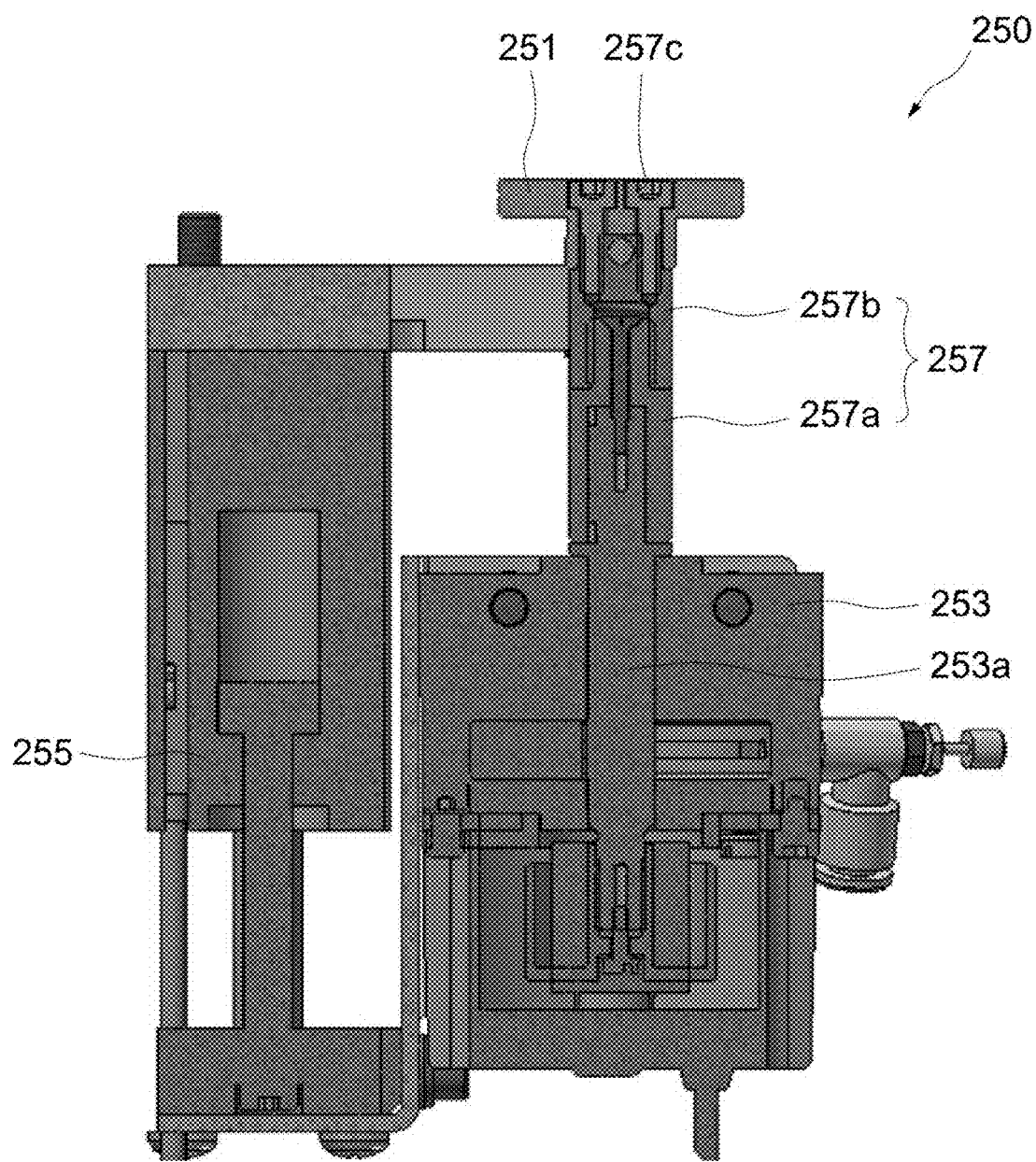
FIG. 9 is a longitudinal cross-sectional view for the chucking unit 250 of FIG. 8.

First, FIG. 8 is an assembled perspective view for a chucking unit 250 of FIG. 2 and FIG. 9 is a longitudinal cross-sectional view for the chucking unit 250 of FIG. 8.

Referring to FIGS. 8 and 9, the chucking unit 250 is configuration caught by a catching jaw (not shown) in a catching groove as a posture is changed after being inserted into the catching groove (not shown) located on a bottom surface of the FOUP C. Specifically, the chucking unit 250 may have a hook 251, a rotation driving unit 253, an elevation driving unit 255, and an intermediate unit 257.

The hook 251 may have a generally elongated shape. The hook 251 has a size that allows the hook 251 to be inserted into the catching groove of the FOUP C.

The rotation driving unit 253 is configured to rotate the hook 251. To this end, the hook 251 may be installed on a rotary shaft 253a of the rotation driving unit 253.

The elevation driving unit 255 is a configuration connected to the rotation driving unit 253 to drive the rotation driving unit 253 and further the hook 251 to move up and down.

The intermediate unit 257 is a configured to be coupled to the rotary shaft 253a of the rotation driving unit 253 to couple the rotary shaft 253a and the hook 251 to each other. The intermediate unit 257 may have a first intermediate element 257a, a second intermediate element 257b, and a fastening element 257c. The first intermediate element 257a is disposed to surround the rotary shaft 253a, and the second intermediate element 257b is coupled to the rotary shaft 253a together with the first intermediate element 257a while surrounding the first intermediate element 257a. Two or more fastening elements 257c are provided to couple the hook 251 to the second intermediate element 257b. Here, since the number of the fastening elements 257c is two or more, the hook 251 is always arranged in a specific direction.

An operation manner of the chucking unit 250 described above will be described with reference to FIG. 10.

Figure 10:
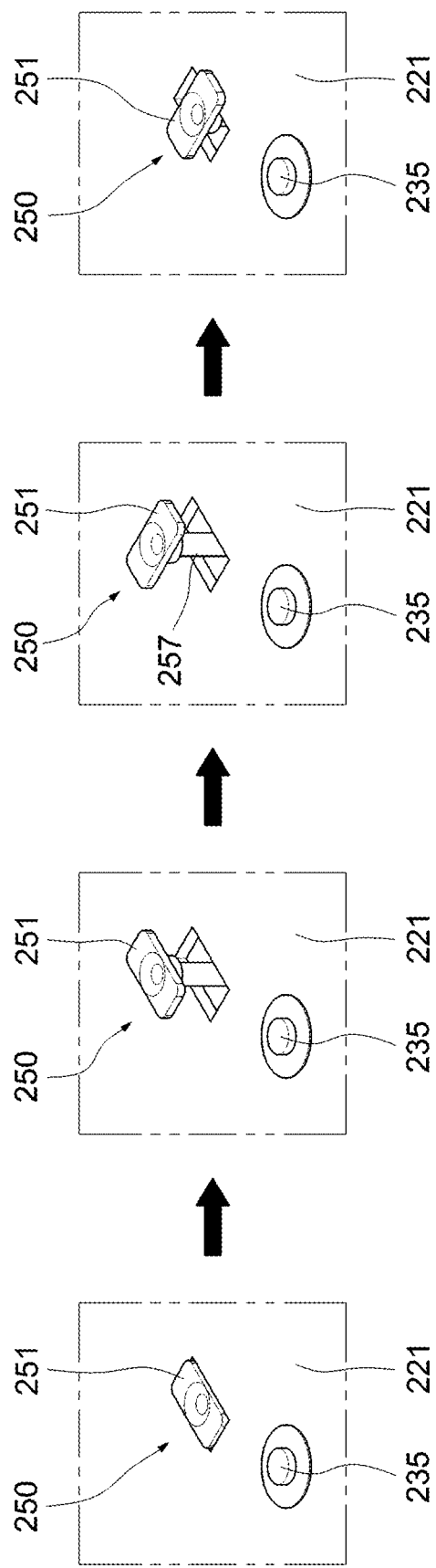
FIG. 10 is a conceptual view showing an operational state of a hook 251 of the chucking unit 250 of FIG. 8.

Next, FIG. 10 is a conceptual view showing an operational state of a hook 251 of the chucking unit 250 of FIG. 8.

Referring to FIG. 10, the hook 251 is exposed to the outside through an opening in the center of the shelf 221. The hook 251 is disposed to correspond to the catching groove of the FOUP C.

When the FOUP C is seated on the shelf 221, the hook 251 is raised by the operation of the elevation driving unit 255. Thereby, the hook 251 is inserted into the catching groove of the FOUP C.

By the operation of the rotation driving unit 253, the hook 251 is rotated in the catching groove. Thereafter, the hook 251 is lowered by the operation of the elevation driving unit 255 to press the catching jaw of the FOUP C.

By such an operation, the FOUP C is fixed by the chucking unit 250 while being seated on the shelf 221. As a result, a state in which the FOUP C is seated on the buffer port 220 while the buffer port 220 (see FIG. 2) moves in the outward direction F and the inward direction R (see FIG. 2) of the storage housing 171 may be stably maintained.

Next, a control method for the above-mentioned EFEM 100 will be described with reference to FIG. 11.

Figure 11:
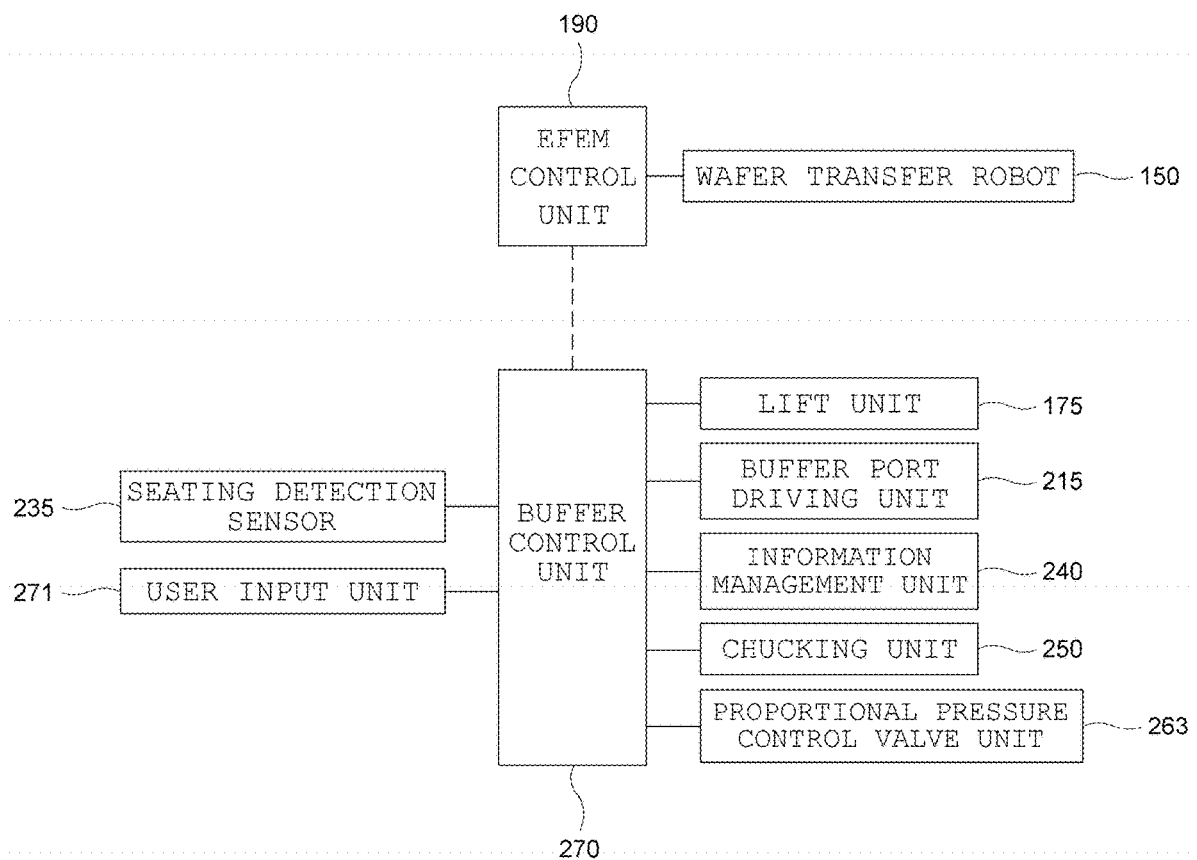
FIG. 11 is a control block diagram for the EFEM 100 of FIG. 1.

FIG. 11 is a control block diagram for the EFEM 100 of FIG. 1.

Referring to FIG. 11 (and the preceding drawings), the EFEM 100 may further have an EFEM control unit 190. The EFEM control unit 190 is a configuration that controls most of the configuration of the EFEM 100 except for the buffer module 170. For example, the EFEM control unit 190 may control the wafer transfer robot 150.

Unlike the above, the buffer module 170 may be controlled by a buffer control unit 270. The buffer control unit 270 may receive a detection result or a control command from the seating detection sensor 235 and a user input unit 271. Here, the user input unit 271 may be an input means such as a keyboard, a touch pad, or the like.

The buffer control unit 270 may control the lift unit 175, the buffer port driving unit 215, the information management unit 240, the chucking unit 250, and the proportional pressure control valve unit 263 based on such a detection result.

For example, the buffer control unit 270 may determine the shape of the FOUP C based on the detection result of the seating detection sensor 235. Depending on the determined shape type of the FOUP C, the buffer control unit 270 may selectively intermit the supply of the inert gas to each of the plurality of supply nozzles 233. This may be achieved by the buffer control unit 270 closing or opening the proportional pressure control valve unit 263. Accordingly, the inert gas may be supplied in the shape corresponding to the structure of the FOUP C even in a field in which different shapes of FOUPs C are used.

In addition, the buffer control unit 270 may control the gas supply line 260 for the FOUP C to purge the wafer by filling the inert gas and may then allow the purge information about the purge operation to be written to the information storage unit of the FOUP C. Specifically, the buffer control unit 270 controls the information management unit 240 to cause the purge information to be transmitted to the information storage unit. Thereby, the wafer information may be updated to reflect the purge information. Then, a central control system of the semiconductor factory may read the information storage unit and may detect a current state of the FOUP C.

In addition, the buffer control unit 270 may adjust the voltage to be applied to the piezo valve seat 330 in the proportional pressure control valve unit 263 based on the flow rate of the inert gas to be filled into the FOUP C. By such a voltage adjustment, the flow rate of the inert gas filled in the FOUP C via the proportional pressure control valve unit 263 may be adjusted.

The EFEM as described above is not limited to the configuration and the operation method of the above-mentioned exemplary embodiments. The above-mentioned exemplary embodiments may be configured so that various modifications may be made by selective combinations of all or some of the respective exemplary embodiments.

According to the EFEM according to the exemplary embodiment of the present invention configured as described above, before seating the FOUP on the load port module so that a wafer transfer robot operating in a transfer chamber transfers the wafer in the FOUP toward the process equipment, or after putting, by the water transfer robot, the wafer into the FOUP seated on the load port module from the process equipment, the inert gas filling operation to the FOUP may be fully performed by the buffer module storing the FOUP and injecting the inert gas into the FOUP to purge the wafer.

Further, the purge operation on the FOUP is performed in the buffer module rather than the load port module, and the FOUP on which the purge operation is performed is seated on the load port module and is processed by the wafer transfer robot, thereby it is possible for the vehicle to unload the FOUP to an empty buffer module at any time.

In addition, the wafer transfer robot may take out the wafer without waiting time in the FOUP that is seated on the load port module, thereby achieving high operation efficiency.

Further, the process equipment may also work without waiting time due to a rapid transfer of the wafer, thereby achieving higher operation efficiency.

What is claimed is:

1. An equipment front end module (EFEM) comprising:
a transfer chamber;
a load port module on which a wafer receiving container, provided by an overhead hoist transport (OHT), is seated;
a wafer transfer robot positioned in the transfer chamber and configured to transfer a wafer in the wafer receiving container seated on the load port module toward a process equipment side; and
a buffer module configured to store the wafer receiving container before or after the seating of the wafer receiving container on the load port module and inject an inert gas into the wafer receiving container to purge the wafer, wherein the buffer module injects the inert gas into the wafer receiving container with or without the inert gas being injected into the wafer receiving container by the load port module,
wherein the buffer module comprises:
a plurality of supply nozzles connected to an injection port of the wafer receiving container to supply the inert gas into the wafer receiving container;
a storage housing having a space to accommodate the wafer receiving container, wherein the load port module is disposed outside the space; and
a buffer port mounted with the plurality of supply nozzles, formed to support the wafer receiving container, and configured to be moved so as to move the wafer receiving container between an inside and an outside of the space along a first path different than a second path along which the overhead hoist transport unloads the wafer receiving container on the load port, wherein the buffer port is placed in the second path such that the buffer port can receive the wafer receiving container from the overhead hoist transport when the buffer port has been moved to the outside of the space.

2. The EFEM of claim 1, wherein the buffer module further includes:
a buffer control unit controlling a supply of the inert gas to each of the plurality of supply nozzles and the buffer port moves along a direction which is different than a direction in which the overhead hoist transport unloads the wafer receiving container onto the load port.

3. The EFEM of claim 2, wherein the buffer module further includes a seating detection sensor detecting whether the wafer receiving container is seated on the buffer port, and
the buffer control unit selectively intermits the supply of the inert gas to each of the plurality of supply nozzles based on a detection result of the seating detection sensor.

4. The EFEM of claim 3, wherein the buffer module further includes a proportional pressure control valve unit adjusting a flow rate of the inert gas supplied to the supply nozzles, and
the buffer control unit intermits the supply of the inert gas by controlling an opening and closing of the proportional pressure control valve unit.

5. The EFEM of claim 3, wherein the buffer port includes a shelf supporting the wafer receiving container while having the seating detection sensor and the supply nozzles.

6. The EFEM of claim 1, wherein the buffer module includes:
an information management unit obtaining wafer information on the wafer written in an information storage unit of the wafer receiving container; and
a buffer control unit controlling the information management unit, and
the buffer control unit transmits purge information to the information storage unit by controlling the information management unit so that the wafer information is updated to reflect the purge information on a purge of the wafer.

7. The EFEM of claim 1, wherein the buffer module further includes a lift unit transferring the wafer receiving container between the buffer port and the load port module,
the buffer port includes:
a corresponding buffer port corresponding to the load port module; and
a non-corresponding buffer port disposed next to the corresponding buffer port, and
the lift unit is configured to be moved between positions corresponding to the corresponding buffer port and the non-corresponding buffer port.

8. The EFEM of claim 1, wherein the buffer module further includes a chucking unit installed in the buffer port and configured to be caught by a catching jaw in a catching groove as a posture is changed after being inserted into the catching groove of the wafer receiving container.

9. The EFEM of claim 8, wherein the chucking unit includes:
a hook positioned to correspond to the catching groove; and
a rotation driving unit rotating the hook to cause the hook to be caught by the catching jaw.

10. The EFEM of claim 9, wherein the chucking unit further includes an elevation driving unit raising the hook before an operation of the rotation driving unit to raise the hook into the catching groove.

11. The EFEM of claim 9, wherein the chucking unit further includes an intermediate unit including a plurality of fastening elements and being coupled to a rotary shaft of the rotation driving unit, and
the hook is configured to be aligned along a set direction by a fastening with the plurality of fastening elements.

12. The EFEM of claim 1, wherein the buffer module further includes:
a proportional pressure control valve unit adjusting a flow rate of the inert gas supplied to the supply nozzle by an area control method.

13. The EFEM of claim 12, wherein the proportional pressure control valve unit includes:
a valve housing including an input port; and
a piezo valve seat installed in the valve housing to adjust a flow area of the inert gas through the input port according to an input voltage.

* * * * *